(12) United States Patent
Iwashige et al.

(10) Patent No.: US 10,763,204 B2
(45) Date of Patent: Sep. 1, 2020

(54) SEMICONDUCTOR DEVICE

(71) Applicants: DENSO CORPORATION, Kariya, Aichi-pref. (JP); C. Uyemura & Co., Ltd., Osaka (JP)

(72) Inventors: Tomohito Iwashige, Kariya (JP); Kazuhiko Sugiura, Kariya (JP); Kazuhiro Miwa, Nagoya (JP); Yuichi Sakuma, Nagoya (JP); Seigo Kurosaka, Hirakata (JP); Yukinori Oda, Hirakata (JP)

(73) Assignees: DENSO CORPORATION, Kariya (JP); C. Uyemura & Co., Ltd., Osaka (JP)

( * ) Notice: Subject to any disclaimer, the term of this patent is extended or adjusted under 35 U.S.C. 154(b) by 10 days.

(21) Appl. No.: 16/284,503

(22) Filed: Feb. 25, 2019

(65) Prior Publication Data

US 2019/0198441 A1 Jun. 27, 2019

Related U.S. Application Data

(63) Continuation of application No. PCT/JP2017/032333, filed on Sep. 7, 2017.

(30) Foreign Application Priority Data

Sep. 12, 2016 (JP) ................................ 2016-177873
Sep. 7, 2017 (JP) ................................ 2017-172030

(51) Int. Cl.
*H01L 23/498* (2006.01)
*H01L 23/00* (2006.01)
(Continued)

(52) U.S. Cl.
CPC .... *H01L 23/49866* (2013.01); *H01L 23/3142* (2013.01); *H01L 24/29* (2013.01);
(Continued)

(58) Field of Classification Search
CPC ......... H01L 23/49866; H01L 23/49582; H01L 23/3142; H01L 24/28–30;
(Continued)

(56) References Cited

U.S. PATENT DOCUMENTS 4,888,449 A * 12/1989 Crane ................... H01L 23/057
174/540
5,221,859 A * 6/1993 Kobayashi .......... H01L 23/4951
257/676

(Continued)

FOREIGN PATENT DOCUMENTS

| JP | 2003-124406 A | 4/2003 |
| JP | 2007-220967 A | 8/2007 |
| WO | 2014/128793 A1 | 8/2014 |

*Primary Examiner* — David A Zarneke
(74) *Attorney, Agent, or Firm* — Posz Law Group, PLC

(57) ABSTRACT

A semiconductor device includes: a semiconductor element; a support as a metallic member that includes a metallized layer having a first component as an iron group element and a second component as a periodic table group five or group six transition metal element other than chromium provided at an outermost surface of the support, and is arranged such that the outermost surface faces the semiconductor element; a joint material that is arranged between the outermost surface of the support and the semiconductor element, and is joined with the outermost surface to fix the semiconductor element to the support; and a molding resin that is arranged to cover a joint body having the support, the joint material and the semiconductor element.

6 Claims, 2 Drawing Sheets

(51) Int. Cl.
*H01L 23/31* (2006.01)
*H01L 23/495* (2006.01)

(52) U.S. Cl.
CPC .... *H01L 23/3107* (2013.01); *H01L 23/49582* (2013.01); *H01L 24/32* (2013.01); *H01L 24/33* (2013.01); *H01L 24/83* (2013.01); *H01L 2224/29139* (2013.01); *H01L 2224/29339* (2013.01); *H01L 2224/32245* (2013.01); *H01L 2224/33181* (2013.01); *H01L 2224/8384* (2013.01); *H01L 2224/83439* (2013.01); *H01L 2924/10272* (2013.01); *H01L 2924/15747* (2013.01); *H01L 2924/181* (2013.01); *H01L 2924/18301* (2013.01)

(58) Field of Classification Search
CPC . H01L 2224/29139; H01L 2224/29172; H01L 2224/29184; H01L 2224/29639; H01L 2224/2968; H01L 2224/29679; H01L 2224/29684; H01L 2224/29681; H01L 2224/83439; H01L 2224/83472; H01L 2224/83479; H01L 2224/8348; H01L 2224/83481; H01L 2224/83484; H01L 2224/8349
See application file for complete search history.

(56) References Cited

U.S. PATENT DOCUMENTS

| | | | | |
|---|---|---|---|---|
| 6,087,714 | A * | 7/2000 | Kubara | H01L 23/49582 257/666 |
| 6,194,777 | B1 * | 2/2001 | Abbott | H01L 23/49582 257/666 |
| 7,112,474 | B1 * | 9/2006 | Glenn | H01L 21/4842 257/E23.043 |
| 7,332,375 | B1 * | 2/2008 | Glenn | H01L 23/49541 257/E21.502 |
| 8,129,229 | B1 * | 3/2012 | Sirinorakul | H01L 23/4951 257/666 |
| 8,318,287 | B1 * | 11/2012 | Glenn | H01L 21/4842 428/123 |
| 8,410,585 | B2 * | 4/2013 | Ahn | H01L 23/3107 257/666 |
| 9,059,185 | B2 * | 6/2015 | Abbott | H01L 21/56 |
| 2002/0185716 | A1 | 12/2002 | Abys et al. | |
| 2004/0209462 | A1 | 10/2004 | Abe | |
| 2009/0017621 | A1 | 1/2009 | Sako et al. | |
| 2013/0140685 | A1 * | 6/2013 | Heinrich | H01L 24/05 257/666 |
| 2014/0159216 | A1 | 6/2014 | Ishino et al. | |
| 2016/0126167 | A1 | 5/2016 | Ishino et al. | |

* cited by examiner

FIG. 3
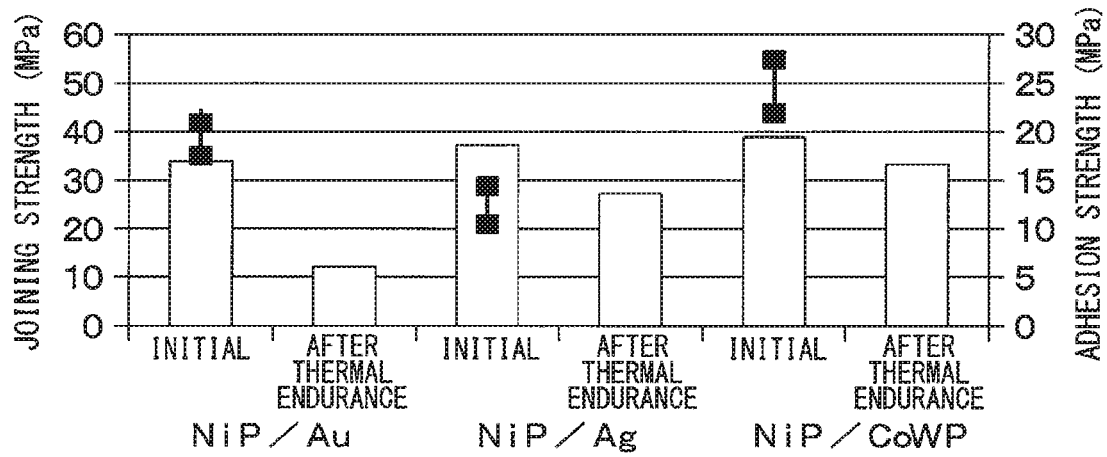
FIG. 4
| | COMPARATIVE EXAMPLE | | |
|---|---|---|---|
| | 1 | 2 | 3 |
| METALLIZED LAYER | NiP | NiP/Au | NiP/PdP/Ag |
| THERMAL ENDURANCE RELIABILITY OF DIE-ATTACH LAYER | NG | NG | OK |
| RESIN ADHESION STRENGTH | OK | OK | NG |
| | EXAMPLE | | | |
|---|---|---|---|---|
| | 1 | 2 | 3 | 4 |
| METALLIZED LAYER | NiP/CoWP | NiP/NiWP | Ni/CoW | Ni/NiW |
| THERMAL ENDURANCE RELIABILITY OF DIE-ATTACH LAYER | OK | OK | OK | OK |
| RESIN ADHESION STRENGTH | OK | OK | OK | OK |
FIG. 5
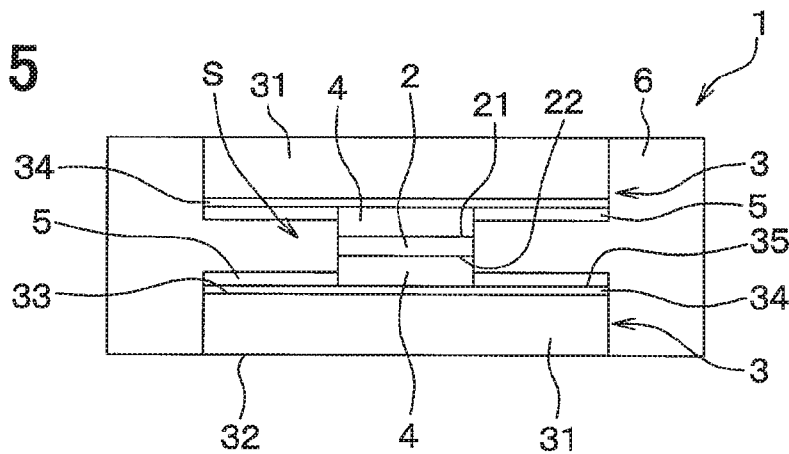

SEMICONDUCTOR DEVICE

CROSS REFERENCE TO RELATED APPLICATIONS

The present application is a continuation application of International Patent Application No. PCT/JP2017/032333 filed on Sep. 7, 2017, which designated the U.S. and claims the benefit of priority from Japanese Patent Application No. 2016-177873 filed on Sep. 12, 2016 and Japanese Patent Application No. 2017-172030 filed on Sep. 7, 2017. The entire disclosures of all of the above applications are incorporated herein by reference.

TECHNICAL FIELD

The present disclosure relates to a semiconductor device.

BACKGROUND

A semiconductor device is formed with a semiconductor element and a support (for example, a support substrate, a heat radiation plate or a heat sink) for supporting the semiconductor element through resin molding.

SUMMARY

The present disclosure provides a semiconductor device including a semiconductor element.

BRIEF DESCRIPTION OF DRAWINGS

FIG. 3 is a graph that shows an evaluation result in each of Examples and each of Comparative Examples.

FIG. 4 is a graph that shows an evaluation result in each of Examples and each of Comparative Examples.

FIG. 5 is a drawing that shows a sectional side view of the schematic configuration of a semiconductor device according to a modification.

DETAILED DESCRIPTION

A comparative example proposes a configuration in which a polyamide resin layer is disposed on the surface of a semiconductor element and the surface of a heat sink for a semiconductor device. According to such a configuration, the adhesive force between the semiconductor element and molding resin and the adhesive force between the heat sink and molding resin are enhanced; therefore, it is possible to restrain peeling of molding resin from the semiconductor device and the heat sink even under a high temperature.

However, there is a demand for achieving both of the thermal endurance reliability of a die-attach portion, which fixes the semiconductor element to the support, and the thermal endurance reliability of a resin-molded portion for the semiconductor device.

According to an aspect of the present disclosure, a semiconductor device includes: a semiconductor element; a support that includes a metallized layer having a first component as an iron group element and a second component as a periodic table group five or group six transition metal element other than chromium provided at an outermost surface of the support, and is arranged such that the outermost surface faces the semiconductor element; a joint material that is arranged between the outermost surface of the support and the semiconductor element, and is joined with the outermost surface to fix the semiconductor element to the support; and a molding resin that is arranged to cover a joint body having the support, the joint material and the semiconductor element.

In the above-mentioned configuration, the metallized layer of the support having the outermost surface is joined with the joint material (for example, a sintered body layer having silver), and is covered with the molding resin. The inventors of the present application have been reviewing diligently and found out that the thermal endurance reliability of the die-attach portion as a joint portion in which the semiconductor element and the support is joined through the joint material and the thermal endurance reliability of the resin-molded portion as a portion where the support is covered with the molding resin can be satisfactorily attained, when the metallized layer has the first component as an iron group element and the second component as the periodic table group 5 or group 6 transition metal element other than chromium.

Hereinafter, an embodiment will be described with reference to the accompanying drawings. In the following description, the same or equivalent parts in the embodiment and a modification described hereinafter will be denoted by the same reference symbols and the description described in the preceding embodiment may be properly applied in the succeeding modification unless otherwise technically contradicted each other.

(Configuration)

Figure 1:
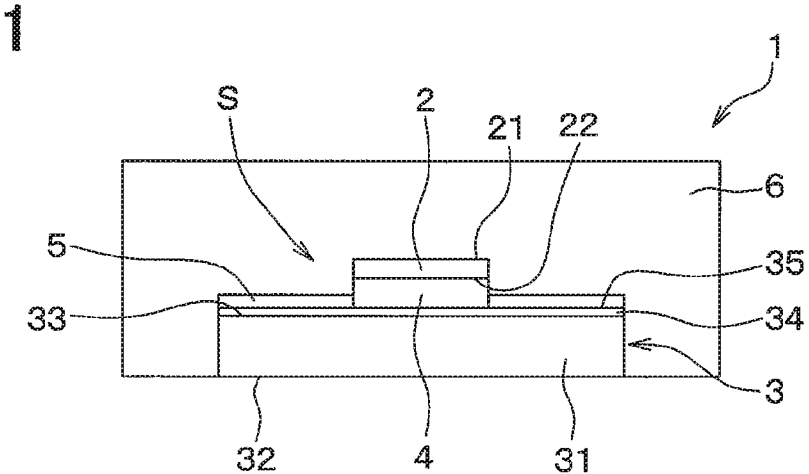
FIG. 1 is a drawing that shows a sectional side elevational view of the schematic configuration of a semiconductor device according to an embodiment.

With reference to FIG. 1, a semiconductor device 1 includes a semiconductor element 2, a support 3, a joint material 4, a primer layer 5 and a molding resin 6.

The semiconductor element 2 is a SiC device suitable for high temperature operation, and is formed in a thin sheet. In the following, the upper side of FIG. 1 is referred to as "upper side", and the lower side of FIG. 1 is referred to as "lower side." That is, the vertical direction in FIG. 1 is parallel to a thickness direction of the semiconductor element 2 formed in a thin sheet. An upper surface 21 as one of the main surfaces of the semiconductor element 2 and a lower surface 22 as the other main surface of the semiconductor element 2 are parallel to each other.

The support 3 is a metallic member formed in a plate that functions as a heat radiation plate, and is arranged to face the lower surface 22 of the semiconductor element 2. A main body 31 of the support 3 is made of a copper plate. An outer surface 32, as one of the main surfaces of the main body 31 (that is, the surface at the lower side in the drawing), is provided to be exposed to outside the molding resin 6 so as to be joined with the heat sink (not shown).

An inner surface 33 as the other main surface of the main body 31 is covered with a metallized layer 34. In the present embodiment, the metallized layer 34 is a plating layer constituting the outermost surface 35 of the support 3, and the outermost surface 35 faces the semiconductor element 2.

The metallized layer 34 according to the present embodiment is formed by a metal thin film. The metal thin film includes a first component as an iron group element (that is, iron, cobalt or nickel) and a second component as a transition metal belonging to a periodic table Group 5 or 6 (that is, molybdenum, vanadium, niobium or tantalum) other than chromium. Specifically, in the present embodiment, the metallized layer 34 includes: a nickel plating layer as an underlying layer adhered to the inner surface 33 of the support 3; and an alloy plating layer formed on the nickel plating layer. The above-mentioned alloy plating layer constituting the outermost surface 35 of the support 3 contains the above-mentioned first and second components.

The joint material 4 is disposed between the outermost surface 35 of the support 3 and the semiconductor element 2, and is joined with the outermost surface 35 to fix the semiconductor element 2 to the support 3. In the present embodiment, the joint material 4 is a sintered body layer containing silver, and is formed by performing heat treatment on silver paste.

The primer layer 5 is a synthetic resin layer provided for enhancing adhesiveness between the support 3 and the molding resin 6, and is disposed between the outermost surface 35 of the support 3 and the molding resin 6. That is, the primer layer 5 is adhered to a portion other than the joining portion with the joint material 4 at the outermost surface 35 of the support 3. In the present embodiment, the primer layer 5 is formed by an aromatic polymer containing an imide group such as polyimide or polyamideimide. The molding resin 6 is an encapsulating resin containing an epoxy resin and/or a maleimide resin, and is provided to cover a joint body S including the support 3, the joint material 4 and semiconductor element 2 as viewed from the semiconductor element 2.

(Effects)

In the above-mentioned configuration, the metallized layer 34 constituting the outermost surface 35 of the support 3 is directly joined with the joint material 4, and is covered with the molding resin 6 through the primer layer 5. In the following description, a joint portion between the semiconductor element 2 and the support 3 through the joint material 4 is referred to as a "die-attach portion." In a structure covering the joint body S with the molding resin 6, a portion where the support 3 and the molding resin 6 are facing to each other (that is, a portion where the support 3 is covered with the molding resin 6) is referred to as "resin-molded portion."

As described above, semiconductor devices suitable for high temperature operation such as a SiC device have been widely used as the semiconductor element 2. Such a semiconductor device is preferably to be used as a power semiconductor device mounted to a power module such as a power control unit for a hybrid automobile. In a module (that is, a power module or the like) on which such a semiconductor device is mounted, there is a demand for higher thermal endurance in the mounting structure. For this reason, it is required to achieve both of thermal endurance reliability of the die-attach portion and thermal endurance reliability of the resin-molded portion.

From a viewpoint of thermal endurance reliability of the die-attach portion, a silver paste sintered body can be suitably used as the joint material 4. However, the silver paste sintered body does not have better adhesion to a Ni metallized layer and an Au metallized layer (for example, a nickel plating layer and NiAu plating layer). For this reason, it is preferable that the outermost surface 35 of the support 3 is formed by a silver metallized layer (for example, NiAg plating layer). On the other hand, the silver metallized layer does not have satisfactory adhesion (in particular, the adhesion strength under high temperature) to the synthetic resin constituting the primer layer 5 and the synthetic resin constituting the molding resin 6. In contrast, the Ni metallized layer and the Au metallized layer have better adhesion to these synthetic resins.

The inventors of the present application have been diligently reviewing the structure of the metallized layer 34 in which the thermal endurance reliability of the die-attach portion and the thermal endurance reliability of the resin-molded portion (that is, the adhesive portion between the outermost surface 35 of the support 3 and the primer layer 5) can be satisfactorily attained. As a result, it is found to be effective such that a portion of the metallized layer 34 constituting at least the outermost surface 35 contains the first component as an iron group element and the second component as a periodic table group 5 or group 6 transition metal element other than chromium. The following describes the comparison between the evaluation results in Examples and the evaluation results in the Comparative Examples.

Figure 2A:
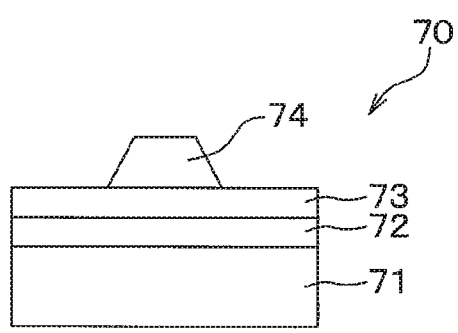
FIG. 2A is a drawing that shows a sectional side elevational view of a test piece for evaluating adhesion strength of a resin-molded portion in each of Examples and each of Comparative Examples.

The inventors of the present application uses a test piece 70 illustrated in FIG. 2A to evaluate the adhesion strength of the resin-molded portion by measuring the shear strength with a shear testing machine. As illustrated in FIG. 2A, the test piece 70 for evaluating the adhesion strength of the resin-molded portion includes a support base 71, a metallized layer 72, a primer layer 73 and a block 74. The support base 71 corresponds to the main body 31 of the support 3 in the semiconductor device 1 illustrated in FIG. 1, is formed with a copper plate. The metallized layer 72 in Examples or Comparative Examples corresponds to the metallized layer 34 in the semiconductor device 1 illustrated in FIG. 1, and is formed on the support base 71. The primer layer 73 corresponds to the primer layer 5 in the semiconductor device 1 illustrated in FIG. 1, and is formed on the metallized layer 72. That is, the primer layer 73 is a polyimide film, and is directly joined with the metallized layer 72. The block 74 corresponds to the molding resin 6 in the semiconductor device 1 illustrated in FIG. 1, and is fixed on the primer layer 73.

Figure 2B:
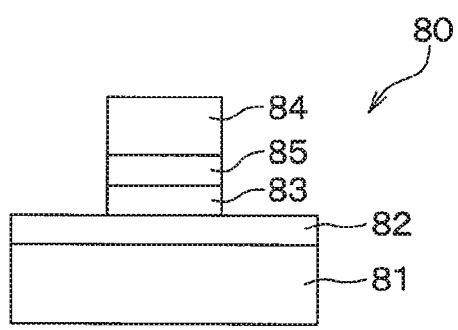
FIG. 2B is a drawing that shows a sectional side elevational view of a test piece for evaluating joining strength of a die-attach portion in each of Examples and each of Comparative Examples.

The inventors of the present application uses a test piece 80 illustrated in FIG. 2B to evaluate the joining strength of the die-attach portion with the same method as described above. As illustrated in FIG. 2B, the test piece 80 for evaluating the joining strength of the die-attach portion includes a support base 81, a metallized layer 82 as viewed from the base material side, a joint material layer 83, a block 84 and a metallized layer 85 as viewed from the block side. The support base 81 is similar to the support base 71 in the test piece 70 illustrated in FIG. 2A, and is formed with a copper plate. The metallized layer 82 as viewed from the base material side is similar to the metallized layer 72 in the test piece 70 illustrated in FIG. 2A. That is, the metallized layer 82 as viewed from the base material side in Examples or Comparative Examples corresponds to the metallized layer 34 in the semiconductor device 1 illustrated in FIG. 1. The joint material layer 83 is a silver paste sintered body corresponding to the joint material 4 in the semiconductor device 1 illustrated in FIG. 1. The block 84 is a copper block that simulates the semiconductor element 2 in FIG. 1. The metallized layer 85 as viewed from the block side is formed at the lower surface of the block 84 facing the joint material layer 83. The metallized layer 85 is similar to the metallized layer 82 as viewed from the base material side disposed on the support base 81. That is, the block 84 is joined with the metallized layer 82 as viewed from the base material side through the metallized layer 85 as viewed from the block side and the joint material layer 83. The metallized layer 82 as viewed from the base material side is formed on the support base 81.

In FIG. 3, the bar graph indicates the results of measurement of the joining strength of the die-attach portion under normal temperature at initial joining and after thermal endurance (that is, after leaving the die-attach portion at 250° C. for 500 hours). In addition, the vertical line graph indicates the results of measurement of the adhesion strength of the resin-molded portion under the high temperature (that is, 225° C.).

In FIG. 3, NiP/CoWp indicates the evaluation result of the NiP/CoWP plating layer (that is, the layer in which electroless CoW alloy plating layer is formed on the underlying electroless nickel plating layer) as the metallized layer in Example. NiP/Au indicates the evaluation result of the NiP/Au plating layer (that is, the layer in which a gold playing layer is formed on the underlying electroless nickel plating layer) as the metallized layer in a Comparative Example. NiP/Ag indicates the evaluation result of the NiP/Ag plating layer (that is, the layer in which a silver plating layer is formed on the underlying electroless nickel plating layer) as the metallized layer in another Comparative Example.

As it is apparent from the evaluation result of FIG. 3, the adhesion strength of the resin-molded portion under the high temperature is satisfactory in a case of the NiP/Au plating layer as the metallized layer in Comparative Example. However, the joining strength of the die-attach portion decreases in a large scale after heat endurance. That is, the thermal endurance reliability of the die-attach portion is not sufficient in a case of the NiP/Au plating layer as the metallized layer in Comparative Example. On the other hand, the thermal endurance reliability of the die-attach portion is satisfactory in a case of the NiP/Ag plating layer as the metallized layer in the other Comparative Example. However, the adhesion strength is not sufficient in the resin-molded portion under the high temperature. In contrast, the adhesion strength of the resin-molded portion under the high temperature and the thermal endurance reliability of the die-attach portion are satisfactory in a case of the NiP/CoWP plating layer as the metallized layer in Example.

In FIG. 4, the metallized layer in Comparative Example 1 is a NiP plating layer (that is, an electroless nickel plating layer). The metallized layer in Comparative Example 2 is the NiP/Au plating layer as described above. The metallized layer in Comparative Example 3 is a NiP/PdP/Ag plating layer (that is, the layer in which a palladium plating layer and a gold plating layer are formed on the underlying electroless nickel plating layer). The metallized layer in Example 1 is the NiP/CoWP plating layer as described above. The metallized layer in Example 2 is a NiP/NiWP plating layer (that is, the layer in which an electroless NiW alloy plating layer is formed on the underlying electroless nickel plating layer). The metallized layer in Example 3 is a Ni/CoW layer. The metallized layer in Example 4 is a Ni/NiW layer.

In the evaluation result of the thermal endurance reliability of the die-attach portion illustrated in FIG. 4, "OK" refers to a situation where "shear strength ratio" is larger than or equal to 0.7 calculated based on the following equation; and "NG" refers to a situation where "shear strength ratio" is smaller than or equal to 0.5 calculated based on the following equation.

Shear Strength Ratio=(Shear Strength after Thermal Endurance)/(Shear Strength at Initial Joining)

The following indicators are used for the evaluation results of the resin adhesion strength (that is, the adhesion strength of the resin-molded portion under high temperature) shown in FIG. 4.

"OK": in a situation where the shear strength at 225° C. is 15 MPa or higher.

"NG": in a situation where the shear strength at 225° C. is 10 MPa or lower or in a situation of shear fracture mode at 225° C. as having a peeling condition at the adhesion boundary between an intermediate layer 72 and the joint layer 73.

As it is apparent from the evaluation result shown in FIG. 4, the respective metallized layers in Comparative Example 1 and Comparative Example 2 are satisfactory in adhesion strength of the resin-molded portion under high temperature. However, the thermal endurance reliability of the die-attach portion is not sufficient. On the other hand, the metallized layer in Comparative Example 3 is satisfactory in the thermal endurance reliability of the die-attach portion. However, the adhesion strength is not sufficient in the resin-molded portion under the high temperature. In contrast, with regard to the respective metallized layers in Examples 1 to 4, the adhesion strength of the resin-molded portion under the high temperature and the thermal endurance reliability of the die-attach portion are satisfactory.

In each of Examples as described above, tungsten was used exclusively as the second component. Periodic table Group 6 transition metal elements containing tungsten and Group 5 transition metal elements such as niobium are transition metal elements where the group numbers are adjacent to each other, and the crystal lattice structures are the same in the metal simple substances. Excluding chromium from the viewpoint of environmental load, the periodic table Group 5 or Group 6 transition metal element, which can be naturally produced, is used as the second component so that the same effect as in Examples as described above can be expected.

In particular, the lattice constants of tungsten, molybdenum, niobium and tantalum are closed to each other. Tungsten, molybdenum, niobium and tungsten completely form a solid solution. In addition, they constitute acid oxide. Thus, the chemical properties are similar. Accordingly, when an element in the fifth to sixth periods of the periodic table Groups 5, 6 is used as the second element, the remarkable effects as described above can be attained. Moreover, tungsten or niobium is capable of displacement plating with the copper contained in the electroless copper plating solution, and tungsten or niobium has barrier property against the copper. Since tungsten and niobium have large cohesive energy, it is considered that the thermal endurance reliability is enhanced through an addition.

(Modification)

The present disclosure is not limited to the embodiment described above and may be appropriately modified. Representative modifications will be described below. In the following description of modifications, only parts different from the above-described embodiment will be described.

The present disclosure is not limited to the specific device configuration shown in the above embodiment. For example, the primer layer 5 may be omitted. In other words, the joint body S in which the semiconductor element 2, the joint material 4 and the support 3 are stacked in order is directly encapsulated by the molding resin 6 without through the primer layer 5.

The metallized layer 34 is not limited to a double-layer structure such as the one in the above-described particular example. For example, the metallized layer 34 may also be a multilayer structure having three or more layers. Alternatively, the metallized layer 34 may also be a single-layer structure as long as the satisfactory barrier property against the copper and the satisfactory film formability of the inner surface 33 of the support 3 can be achieved. In particular, for example, the NiP/CoWp double-layer plating as described in the above particular example can be modified to Ni—Co—W—P alloy plating having a single layer. Alternatively, the underlying nickel plating layer in each of the particular examples as described above may be omitted. Furthermore, in the compositions corresponding to the above-mentioned Examples 1 and 2, phosphorus is contained for the convenience of electroless plating treatment. However, the present disclosure is not limited to the compositions containing phosphorus. In view of the situation where the phosphorus is contained not only in Examples 1 and 2 but also in Comparative Examples, and in view of the situation where the phosphorus is not contained in the compositions in Examples 3 and 4, it is apparent that the metallized layer 34 with the composition not containing phosphorus (in other words, the metallized layer 34 is formed by, for example, electrolytic plating) can also exhibit the remarkable effects described in the present disclosure.

The formation method of the metallized layer 34 is not limited to plating. The metallized layer 34 can be also formed by vapor deposition such as CVD. CVD stands for Chemical Vapor Deposition.

The support 3 may be a DBC substrate or a DBA substrate. DBC stands for Direct Bonded Copper. DBA stands for Direct Bonded Aluminum. Alternatively, the support 3 may also be a joint body of a heat sink such as a copper plate and the DBC substrate or the DBA substrate.

As illustrated in FIG. 5, the support 3 and the joint material 4 are not only attached to the upper surface 21 of the semiconductor element 2 but also can be attached to the lower surface 22 of the semiconductor element 2. In other words, the support 3 and the joint material 4 can be attached to each of the upper surface 21 and the lower surface 22 of the semiconductor element 2.

The modifications are not limited to the above-described examples. A plurality of modifications may be combined with each other. Furthermore, all or a part of the above-described embodiment and all or a part of the modifications may be combined with each other.

The invention claimed is:

1. A semiconductor device comprising:
   a semiconductor element;
   a support including a metallized layer having a first component as an iron group element and a second component as a periodic table group five or group six transition metal element other than chromium, the metallized layer provided at an outermost surface of the support, the outermost surface facing the semiconductor element;
   a joint material arranged between the outermost surface of the support and the semiconductor element, and joined with the outermost surface to fix the semiconductor element to the support; and
   a molding resin arranged to cover a joint body having the support, the joint material and the semiconductor element.

2. The semiconductor device according to claim 1, wherein:
   the joint material is a sintered body layer having silver.

3. The semiconductor device according to claim 1, further comprising:
   a primer layer as a synthetic resin layer provided between the outermost surface of the support and the molding resin.

4. The semiconductor device according to claim 3, wherein:
   the primer layer includes an aromatic polymer having an imide group.

5. The semiconductor device according to claim 1, wherein:
   the joint material and the support are attached to the upper surface of the semiconductor element, and are attached to the lower surface of the semiconductor element.

6. The semiconductor device according to claim 1, wherein:
   the metallized layer further has phosphorus.

* * * * *